(12) United States Patent
Miao et al.

(10) Patent No.: US 10,141,448 B1
(45) Date of Patent: Nov. 27, 2018

(54) VERTICAL FETS WITH DIFFERENT GATE LENGTHS AND SPACER THICKNESSES

(71) Applicant: International Business Machines Corporation, Armonk, NY (US)

(72) Inventors: Xin Miao, Guilderland, NY (US); Kangguo Cheng, Schenectady, NY (US); Chen Zhang, Albany, NY (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/853,822

(22) Filed: Dec. 24, 2017

(51) Int. Cl.
| | |
|---|---|
| *H01L 29/786* | (2006.01) |
| *H01L 29/06* | (2006.01) |
| *H01L 29/66* | (2006.01) |
| *H01L 21/8238* | (2006.01) |
| *H01L 21/32* | (2006.01) |
| *H01L 21/02* | (2006.01) |

(52) U.S. Cl.
CPC .. *H01L 29/78642* (2013.01); *H01L 21/02263* (2013.01); *H01L 21/32* (2013.01); *H01L 21/82385* (2013.01); *H01L 21/823842* (2013.01); *H01L 21/823864* (2013.01); *H01L 21/823885* (2013.01); *H01L 29/0653* (2013.01); *H01L 29/66803* (2013.01); *H01L 29/78618* (2013.01); *H01L 29/78696* (2013.01)

(58) Field of Classification Search
CPC ......... H01L 29/78642; H01L 21/82385; H01L 21/823864; H01L 21/823885; H01L 29/66803; H01L 29/78618; H01L 29/78696
See application file for complete search history.

(56) References Cited

U.S. PATENT DOCUMENTS

| | | |
|---|---|---|
| 6,303,466 B1 | 10/2001 | Shimonishi et al. |
| 7,074,656 B2 | 7/2006 | Yeo et al. |
| 8,637,849 B2 | 1/2014 | Deligianni et al. |
| 9,437,503 B1 * | 9/2016 | Mallela ............... H01L 21/8238 |
| 9,530,700 B1 | 12/2016 | Mallela et al. |
| 9,530,866 B1 | 12/2016 | Zhang et al. |
| 9,741,626 B1 | 8/2017 | Cheng et al. |
| 2017/0054027 A1 | 2/2017 | Liu |
| 2017/0178970 A1 | 6/2017 | Anderson et al. |

* cited by examiner

*Primary Examiner* — Fei Fei Yeung Lopez
(74) *Attorney, Agent, or Firm* — Vazken Alexanian; Michael J. Chang, LLC (57) ABSTRACT

Techniques for forming VFETs with differing Lg using fins of the same height are provided. In one aspect, a method of forming a VFET device includes: patterning (first/second) fins having a uniform fin height in a substrate; forming bottom source/drains at a base of the fins; forming first bottom spacers on the bottom source/drains; selectively forming second bottom spacers (as a dopant source) at the base of the second fins; driving dopants from the bottom source/drains into the first fins and also from second bottom spacers into the second fins to form bottom junctions having a height H1 and H2, respectively, wherein H2>H1; forming gates along the fins, wherein the gates along the first/second fins have Lg1/Lg2, wherein Lg1>Lg2 based on H2>H1; forming top spacers above the gates; and forming top source and drains above the top spacers. VFET devices are also provided.

20 Claims, 7 Drawing Sheets

VERTICAL FETS WITH DIFFERENT GATE LENGTHS AND SPACER THICKNESSES

FIELD OF THE INVENTION

The present invention relates to vertical field effect transistors (VFETs), and more particularly, to techniques for forming VFETs with differing gate lengths Lg on the same wafer using fins of the same height.

BACKGROUND OF THE INVENTION

As opposed to planar complementary metal-oxide-semiconductor (CMOS) devices, vertical field effect transistors (VFETs) are oriented with a vertical fin channel disposed on a bottom source/drain and a top source/drain disposed on the fin channel. The gate runs vertically alongside the vertical fin channel. Thus, with VFETs the gate length (Lg) is decoupled from the device footprint, and as such VFETs have been pursued as a potential device option for scaling CMOS to the 5 nanometer (nm) node and beyond.

A reduction in chip power consumption can be realized by increasing the gate length (Lg) of transistors (as compared to nominal transistors) along non-critical paths on the chip as this reduces off current leakage. With conventional lateral FETs, the gate length can simply be increased (e.g., from about 2 nanometers (nm) to about 10 nm longer than nominal FETs) to increase threshold voltage (Vt) by about 20 millivolt (mV). However, in VFET architecture it is very difficult to vary fin height to achieve a different Lg relative to nominal VFETs on the same wafer.

Thus, techniques for achieving different Lg with VFET devices having the same fin height would be desirable.

SUMMARY OF THE INVENTION

The present invention provides techniques for forming vertical field effect transistor (VFETs) with differing gate lengths Lg on the same wafer using fins of the same height. In one aspect of the invention, a method of forming a VFET device is provided. The method includes: patterning fins having a uniform fin height in a substrate, wherein at least a first one of the fins includes a vertical fin channel of a first VFET and wherein at least a second one of the fins includes a vertical fin channel of a second VFET; forming bottom source and drains at a base of the fins, wherein the bottom source and drains are doped; forming first bottom spacers on the bottom source and drains at the base of the fins; selectively forming second bottom spacers on the first bottom spacers at the base of the at least one second fin, wherein the second bottom spacers are configured to serve as a dopant source; annealing the substrate under conditions sufficient to drive dopants i) from the bottom source and drains into the at least one first fin and ii) from the bottom source and drains and from the second bottom spacers into the at least one second fin, forming bottom junctions at the base of the at least one first fin having a height H1 and bottom junctions at the base of the at least one second fin having a height H2, wherein H2>H1; forming gates along sidewalls of the fins above the bottom source and drains, wherein the gates along the sidewalls of the at least one first fin have a gate length Lg1 and the gates along the sidewalls of the at least one second fin have a gate length Lg2, wherein Lg1>Lg2 based on H2>H1; forming top spacers above the gates at tops of the fins; and forming top source and drains above the top spacers at the tops of the fins.

In another aspect of the invention, a VFET device is provided. The VFET device includes: fins patterned in a substrate to a uniform fin height, wherein at least a first one of the fins includes a vertical fin channel of a first VFET and wherein at least a second one of the fins includes a vertical fin channel of a second VFET; bottom source and drains at a base of the fins, wherein the bottom source and drains are doped; first bottom spacers disposed on the bottom source and drains at the base of the fins; second bottom spacers disposed on the first bottom spacers at the base of only the at least one second fin, wherein the second bottom spacers are configured to serve as a dopant source such that bottom junctions at the base of the at least one first fin having a height H1 and bottom junctions at the base of the at least one second fin having a height H2, and wherein H2>H1; gates disposed along sidewalls of the fins above the bottom source and drains, wherein the gates along the sidewalls of the at least one first fin have a gate length Lg1 and the gates along the sidewalls of the at least one second fin have a gate length Lg2, wherein Lg1>Lg2 based on H2>H1; top spacers above the gates at tops of the fins; and top source and drains above the top spacers at the tops of the fins.

A more complete understanding of the present invention, as well as further features and advantages of the present invention, will be obtained by reference to the following detailed description and drawings.

DETAILED DESCRIPTION OF PREFERRED EMBODIMENTS

As provided above, it is desirable to be able to incorporate devices with an increased gate length (Lg) along with nominal transistor (i.e., on the same wafer) to reduce off leakage current along non-critical paths, and thereby reducing overall power consumption. However, varying the fin height amongst vertical field effect transistor (VFET) devices (i.e., so as to achieve a different Lg) on the same wafer is very difficult as it requires processing of each set of fins individually to achieve different fin heights.

Advantageously, provided herein are techniques for forming VFET devices with different Lg using fins of the same height on the same wafer. Reference will be made herein to 'Wimpy' VFETs, which are VFETs with an Lg that is slightly greater than a nominal VFET transistor. For instance, the Lg of a wimpy VFET is from about 1.5 nanometers (nm) to about 10 nm and ranges therebetween greater than the Lg of a nominal VFET. In accordance with the present techniques, wimpy VFETs are formed with the same fin height as the nominal VFETs but having a longer Lg than the nominal VFETs. In the description that follows reference will be made to two VFET designs, one having a longer gate length Lg1, and another having a regular gate length Lg2, i.e., Lg1>Lg2. As provided above, the difference between Lg1 and Lg2, i.e., Lg1–Lg2, is from about 1.5 nm to about 10 nm and ranges therebetween.

As will be described in detail below, the Lg of the devices (having the same fin height) is selectively varied by changing the total bottom spacer thickness and the doping profile in the bottom source and drains of the nominal VFETs (relative to the wimpy VFETs) using an additional bottom spacer as a dopant source. By way of example only, the dopant source can be a boron-doped glass (i.e., borosilicate glass or BSG) or phosphorous-doped glass (i.e., phosphosilicate glass or PSG) bottom spacer.

An exemplary methodology for forming a VFET device in accordance with the present techniques is now described by way of reference to FIGS. 1-13. In the following example, the fabrication of one (nominal) VFET having a (shorter) gate length Lg2 (i.e., VFET2 in the following description) and one (wimpy) VFET having a (longer) gate length Lg1 (i.e., VFET1 in the following description) on the same chip will be described. However, it is to be understood that the process can be implemented in the same manner described to produce VFETs of either type in multiples and/or individually. Advantageously, these Lg1 and Lg2 devices will be formed using a common fin etch process with fins of the same height, thereby vastly simplifying the production process.

Figure 1:
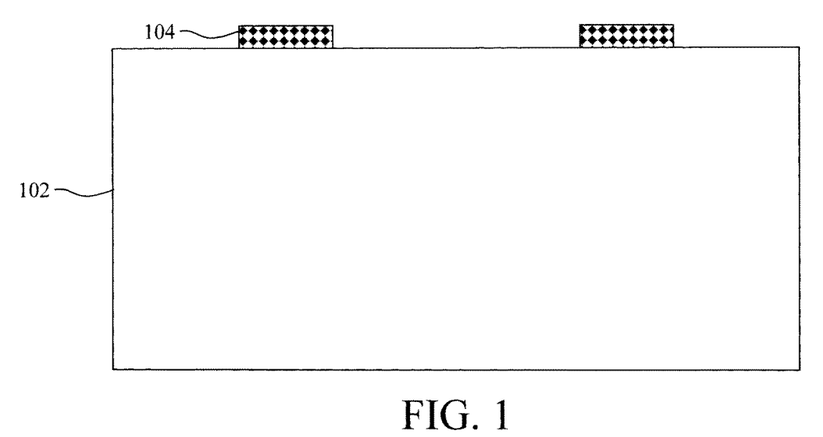
FIG. 1 is a diagram illustrating mandrels having been formed on a substrate according to an embodiment of the present invention.
Figure 2:
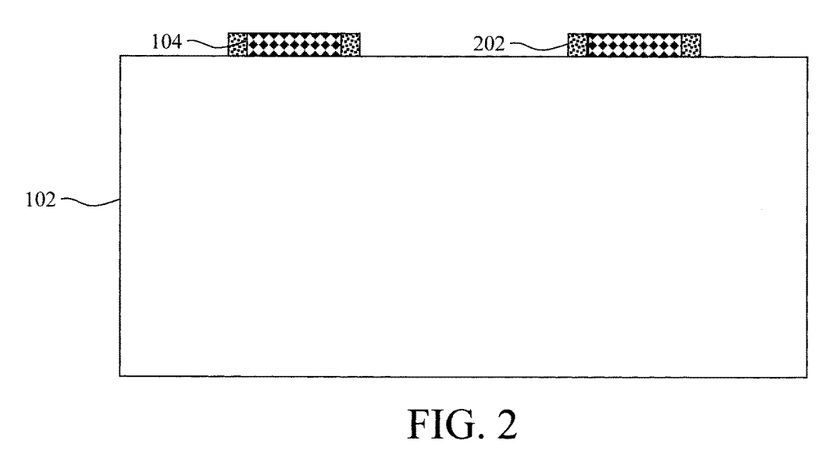
FIG. 2 is a diagram illustrating sidewall spacers having been formed on opposite sides of the mandrels according to an embodiment of the present invention.

As shown in FIG. 1, the process begins with an undoped substrate 102. A variety of different substrate 102 configurations can be implemented in accordance with the present techniques. For instance, according to one exemplary embodiment, the starting substrate 102 is a bulk semiconductor wafer, such as a bulk silicon (Si), bulk germanium (Ge), bulk silicon germanium (SiGe) and/or bulk III-V semiconductor wafer. Alternatively, substrate 102 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor.

One or more fins of uniform height will be patterned in the substrate 102. Generally, each of the VFETs formed herein will have a vertical fin channel extending up from the substrate. Top and bottom source and drains are situated in electrical contact with the top and bottom ends of the channel region, respectively. A gate is disposed alongside on one or more of the fin sidewalls. However due to selective doping, the VFET2 device(s) will have a shorter gate length than the VFET1 devices.

Next, fins are patterned in the substrate 102 corresponding to at least one vertical fin channel of the VFET1 device and at least one vertical fin channel of the VFET2 device. Standard lithography and etching techniques can be implemented to directly pattern the fins from a patterned fin hardmask. However, other patterning techniques are also contemplated herein. For instance, a sidewall image transfer (SIT) technique is shown illustrated in the figures. An advantage to an SIT process is that SIT permits the patterning of feature sizes below that which can be achieved using direct patterning. Thus, with SIT fins can be patterned at a sub-lithographic pitch.

As shown in FIG. 1, SIT involves using standard lithography and etching techniques to first pattern mandrels 104 on the substrate 102. The mandrels 104 are a sacrificial structure used to place sidewall spacers for fin patterning. Thus, the mandrels 104 are formed from a material that can be selectively removed relative to the spacers such as amorphous silicon, poly-silicon, amorphous carbon, silicon germanium (SiGe), an organic planarization layer (OPL), silicon dioxide ($SiO_2$) and/or SiN.

Following patterning of the mandrels 104, sidewall spacers 202 are formed on opposite sides of the mandrels. See FIG. 2. By way of example only, a suitable spacer material is blanket deposited onto and covering the mandrels 104. The spacer material is then patterned into the individual spacers 202 using, e.g., a directional etching process such as reactive ion etching (RIE). Suitable materials for spacers 202 include, but are not limited to, $SiO_2$, SiN, silicon oxynitride (SiON), silicon carbide (SiC) and/or amorphous carbon. However, as provided above, the mandrels 104 will be removed selective to the spacers 202. Thus, the choice of mandrel and spacer material should be made to permit this etch selectivity. For instance, when the mandrels 104 are formed from an oxide material such as $SiO_2$, the spacers 202 can be formed from a nitride material (such as SiN), or vice versa. As such, an oxide- or nitride-selective etch can be used to remove one (oxide or nitride) material relative to the other. According to a non-limiting exemplary embodiment, the mandrels 104 are formed from an oxide material and the spacers 202 are formed from a nitride material. Thus after removal of the mandrels 104, a nitride fin hardmask formed by the spacers 202 remains for fin patterning.

Figure 3:
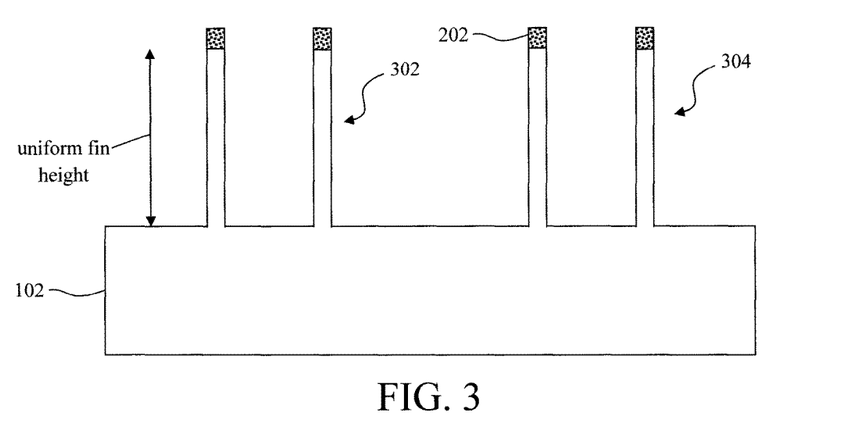
FIG. 3 is a diagram illustrating the mandrels having been selectively removed leaving behind individual fin hardmasks formed by the sidewall spacers, and the sidewall spacers having been used to pattern the hardmask layer into individual fins hardmasks, and the fin hardmasks having been used to pattern at least one first fin and at least one second fin in the substrate according to an embodiment of the present invention.

As shown in FIG. 3, the mandrels 104 have been selectively removed leaving behind individual fin hardmasks formed by the spacers 202. It is notable that the SIT process described herein is a pitch doubling technique. Namely, there are now two spacers 202/fin hardmask for every mandrel 104 originally patterned on the substrate 102.

The spacers 202/fin hardmask are then used to pattern at least one fin 302 and at least one fin 304 in the substrate 102. In the present example, fins 302 will serve as the vertical fin channels for the VFET1 (longer gate length Lg1) devices, and the fins 304 will serve as the vertical fin channels for the VFET2 (shorter gate length Lg2) devices. Notably however, at this stage in the process the fins 302 and 304 have a uniform (i.e., a same) fin height as one another. As highlighted above, patterning vertical fin channels of different lengths in the same device (i.e., on the same wafer) is a very difficult task potentially involving multiple masking and etching steps. Thus, incorporating a uniform fin height in the process flow provides a significant savings in terms of production time and complexity. As shown in FIG. 3, the fins 302 and 304, as patterned, extend partway through the substrate 102.

Figure 4:
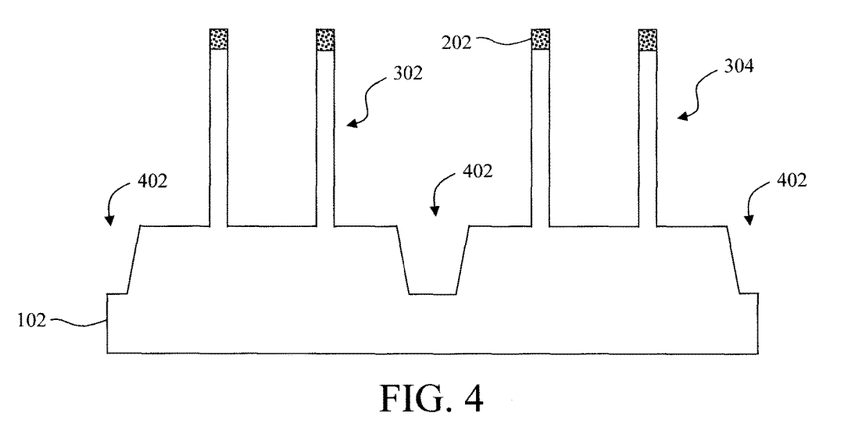
FIG. 4 is a diagram illustrating trenches having been patterned in the substrate separating the first fins from the second fins according to an embodiment of the present invention.

Shallow trench isolation (STI) is then used to isolate the fins 302 corresponding to the VFET1 (longer gate length Lg1) devices from the fins 304 corresponding to the VFET2 (shorter gate length Lg2) devices. See FIG. 4 and FIG. 5. For instance, as shown in FIG. 4 trenches 402 are first patterned in the substrate 102 separating the fins 302 from the fins 304. The fins 302 and 304 are then buried in an insulator 502 that fills the trenches 402. See FIG. 5. Suitable insulators 502 include, but are not limited to oxide materials such as $SiO_2$. When the insulator 502 is an oxide, it is also generically referred to herein as an STI oxide.

Figure 5:
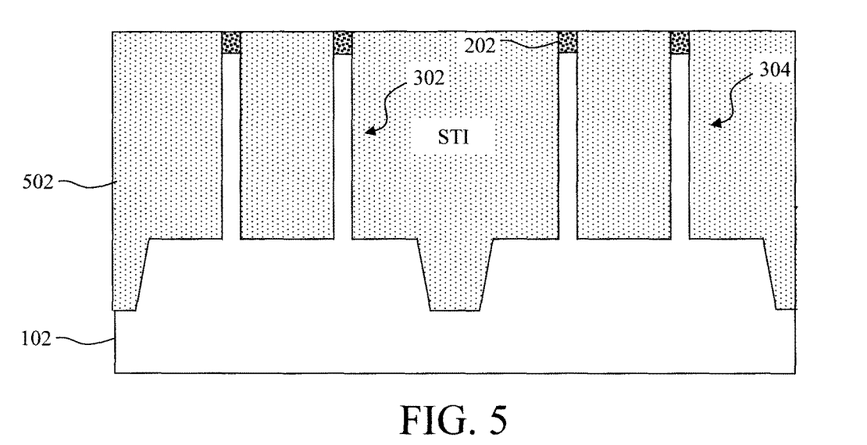
FIG. 5 is a diagram illustrating the fins having been buried in an insulator that fills the trenches according to an embodiment of the present invention.

As shown in FIG. 5, the as-deposited insulator 502 is polished down to the spacers 202/fin hardmasks. Suitable polishing techniques include, but are not limited to, chemical-mechanical polishing (CMP).

Figure 6:
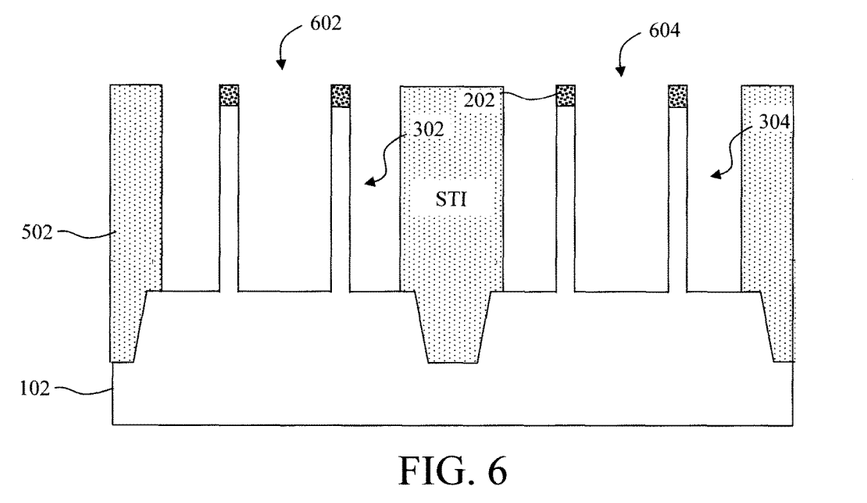
FIG. 6 is a diagram illustrating the insulator having been removed from along sidewalls of the fins, forming trenches in the insulator with the fins being present in the trenches in the insulator according to an embodiment of the present invention.

Standard lithography and etching techniques are next used to pattern the insulator 502, opening up the insulator 502 in gate regions of the VFET1 and VFET2 devices. See FIG. 6. Namely, as provided above, fins 302 correspond to the VFET1 (longer gate length Lg1) devices and fins 304 correspond to the VFET2 (shorter gate length Lg2) devices. Thus, as shown in FIG. 6, opening up the gate regions of the VFET1 and VFET2 devices involves removing the insulator 502 from along the sidewalls of the fins 302 and 304, forming trenches 602 and 604 in the insulator 502. As such, fins 302 and 304 are present in the trenches 602 and 604 in the insulator 502, respectively.

Bottom source and drains 702 and 704 are then formed in the trenches 602 and 604 at the base of the fins 302 and 304, respectively. See FIG. 7. According to an exemplary embodiment, the bottom source and drains 702 and 704 are formed from an in-situ doped (i.e., during growth) or ex-situ doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As), and suitable p-type dopants include, but are not limited to, boron (B).

Figure 7:
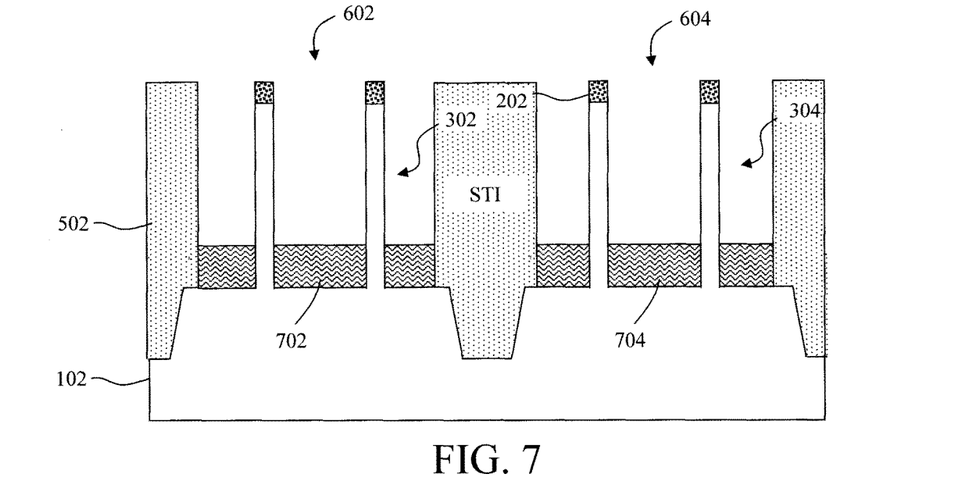
FIG. 7 is a diagram illustrating bottom source and drains having been formed at the base of the fins according to an embodiment of the present invention.

However, other techniques are also contemplated herein for forming the bottom source and drains 702 and 704. For instance, alternatively, the bottom source and drains 702 and 704 are formed using ion implantation of a dopant(s) into the substrate 102 beneath the fins 302 and 304. As provided above, suitable n-type dopants include phosphorous (P) and/or arsenic (As), and suitable p-type dopants include, but are not limited to, boron (B).

A bottom spacer(s) will be formed on the bottom source and drains 702 and 704. However as provided above, the gate length in the VFET2 (shorter gate length Lg2) devices will be shortened using an additional bottom spacer as a dopant source (selectively) in the VFET2 devices to alter the doping profile of the VFET2 devices relative to the VFET1 (longer gate length Lg1) devices. Namely, the bottom spacer acting as a dopant source will raise the height of the bottom junction of the VFET2 (shorter gate length Lg2) thereby effectively reducing the gate length of the VFET2 devices relative to the VFET1 devices. According to an exemplary embodiment, the additional bottom spacer that serves as this dopant source is a boron-doped glass (BSG) or phosphorous-doped glass (PSG) bottom spacer.

Figure 8:
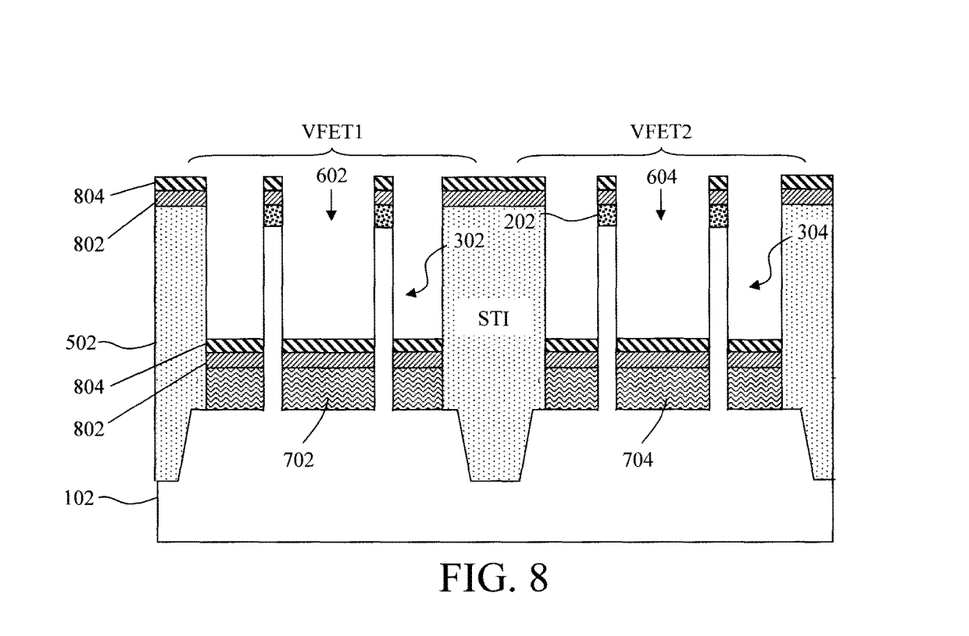
FIG. 8 is a diagram illustrating first bottom spacers having been deposited onto the bottom source and drains, and second bottom spacers having been deposited onto the first bottom spacers according to an embodiment of the present invention.

For instance, as shown in FIG. 8 first bottom spacers 802 are deposited onto the bottom source and drains 702 and 704 in both the VFET1 and VFET2 devices. See FIG. 8 where the regions of the substrate 102 having fins 302 and corresponding to the VFET1 (longer gate length Lg1) devices is labeled ("VFET1") and the region of the substrate 102 having fins 304 and corresponding to the VFET2 (shorter gate length Lg2) devices is labeled ("VFET2"). Namely, up to (and including) this step both (VFET1 and VFET) regions of the substrate 102 have been processed concurrently in the same manner, from fin patterning, STI, bottom source and drain formation, and dual (first/second bottom spacer). After this point, however, selective processing of the regions will be needed to tune the gate length. See below.

Suitable materials for the first bottom spacers 802 include, but are not limited to, a low-κ material such as silicon oxycarbide (SiOC) and silicoboron carbonitride (SiBCN). The terms "low-κ" and "high-κ" as used herein refer to a material having a relative dielectric constant κ which is lower or higher than that of silicon nitride.

According to an exemplary embodiment, the first bottom spacers 802 are formed using a directional deposition process whereby the spacer material is deposited onto the bottom source and drains 702 and 704, fin hardmasks 202 and (STI) insulator 502 with a greater amount of the material being deposited on horizontal surfaces (including on top of the bottom source and drains 702 and 704), as compared to vertical surfaces (such as along sidewalls of the fins 302 and 304). Thus, when an etch is used on the spacer material, the timing of the etch needed to remove the spacer material from the vertical surfaces will leave the first bottom spacers 802 shown in FIG. 8 on the bottom source and drains 702 and 704, as well as on the fin hardmasks 202 and (STI) insulator 502 since a greater amount of the spacer material was deposited on these (horizontal) surfaces to begin with. By way of example only, a high density plasma (HDP) chemical vapor deposition (CVD) or physical vapor deposition (PVD) process can be used for directional film deposition, and an oxide- or nitride-selective (depending on the spacer material) isotropic etch can be used to remove the (thinner) spacer material deposited onto the vertical surfaces.

The designation "first" as given to the bottom spacers 802 is used to signify that a dual bottom spacer configuration is implemented herein whereby second bottom spacers 804 are next deposited onto the first bottom spacers 802. See FIG. 8. While the second bottom spacers will be selectively removed from the VFET1 (longer gate length Lg1) devices, both first/second dual bottom spacers 802 and 804 are initially deposited in both (VFET1 and VFET2) regions of the substrate 102 as shown in FIG. 8.

These second bottom spacers 804 will serve as an additional dopant source in the VFET2 (shorter gate length Lg2) devices. Thus, during a subsequent drive-in anneal dopants from the second bottom spacer 804 will be driven upwards into the vertical fin channel (fins 304) of the VFET2 devices changing the dopant profile at the bottom junction and effectively shortening the gate length of the VFET2 devices. Suitable materials for the second spacers 804 include, but are not limited to, BSG (a boron (p-type) dopant source) and PSG (a phosphorous (n-type) dopant source).

As with the first bottom spacers 802, the second bottom spacers 804 are deposited using a directional deposition process whereby the spacer material is deposited with a greater amount of the material being deposited on horizontal surfaces, as compared to vertical surfaces. Thus, when an etch is used on the spacer material, the timing of the etch needed to remove the spacer material from the vertical surfaces will leave the second bottom spacers 804 shown in FIG. 8 on the first bottom spacers 802 over the bottom source and drains 702 and 704, as well as on the first bottom spacers 802 over the fin hardmasks 202 and (STI) insulator 502 since a greater amount of the spacer material was deposited on these (horizontal) surfaces to begin with.

According to an exemplary embodiment, directional deposition of the first bottom spacer material is performed (with a greater amount being deposited onto the horizontal surfaces) followed by directional deposition of the second bottom spacer material onto the first bottom spacer material (again with a greater amount being deposited onto the horizontal surfaces). After deposition of both (first/second) dual bottom spacer materials, an etch or series of etch steps is then used to remove the first and second spacer materials from the vertical surfaces.

Alternatively, a directional deposition of the first bottom spacer material can be performed (with a greater amount being deposited onto the horizontal surfaces) followed by an etch to remove the first spacer material from the vertical surfaces. Next, a directional deposition of the second bottom spacer material can be performed over the first bottom spacer material (with a greater amount being deposited onto the horizontal surfaces) followed by an etch to remove the second spacer material from the vertical surfaces.

Since the additional dopant source provided by the second bottom spacers 804 is needed only in the VFET2 (shorter gate length Lg2) devices, selective processing is needed to remove the second bottom spacers 804 from the VFET1 (longer gate length Lg1) devices. To do so, a block mask 902 is formed selectively masking the fins 304 (and the first and second bottom spacers 802/804) in the VFET2 (shorter gate length Lg2) region of the substrate 102 (i.e., where the second spacers 804 are intended to remain). See FIG. 9.

Figure 9:
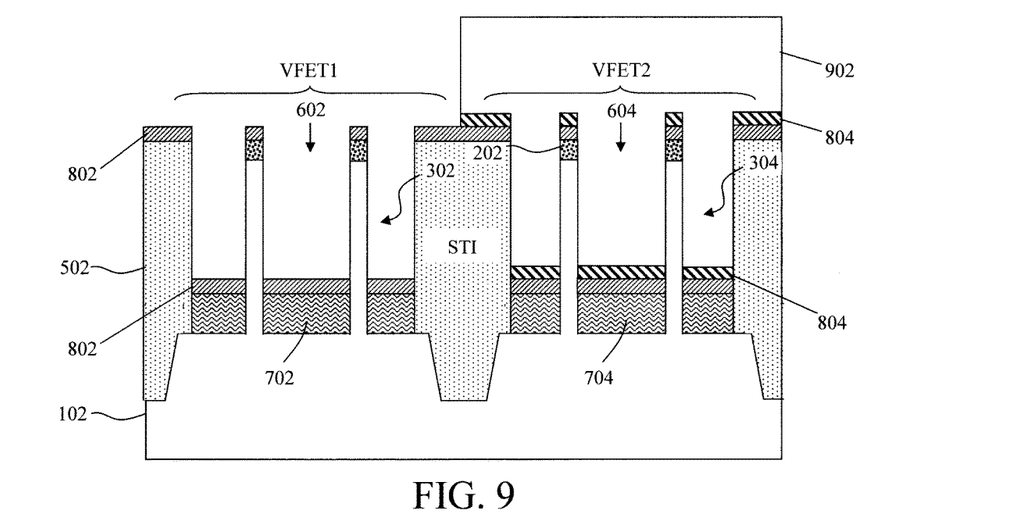
FIG. 9 is a diagram illustrating a block mask having been formed selectively masking the second fins and the first and second bottom spacers at the second fins, and an etch having been used to remove the second bottom spacers from the first fins according to an embodiment of the present invention.

With the block mask 902 in place over the VFET2 (shorter gate length Lg2) region of the substrate 102, an etch is used to remove the second bottom spacers 804 from the VFET1 (longer gate length Lg1) region of the substrate 102. See FIG. 9. As shown in FIG. 9, the result is that the second bottom spacers 804 remain (as an additional dopant source at the base of the fins 304) in only the VFET2 (shorter gate length Lg2) region of the substrate 102. Following the etch of the second bottom spacers 804 in the VFET1 (longer gate length Lg1) region of the substrate 102, the block mask 902 is removed.

A drive-in anneal is then performed wherein the substrate 102 is annealed under conditions sufficient to i) drive dopants from the bottom source and drains 702 into the fins 302 in the VFET1 (longer gate length Lg1) region of the substrate 102, and ii) drive dopants from the bottom source and drains 704 and the second bottom spacers 804 (as an additional dopant source to the bottom source and drains 704) into the fins 304 in the VFET2 (shorter gate length Lg2) region of the substrate 102. See FIG. 10. According to an exemplary embodiment, the conditions for the drive-in anneal include a temperature of from about 800° C. to about 1300° C., and ranges therebetween, and a duration of from about 0.01 seconds to about 10 minutes, and ranges therebetween.

Figure 10:
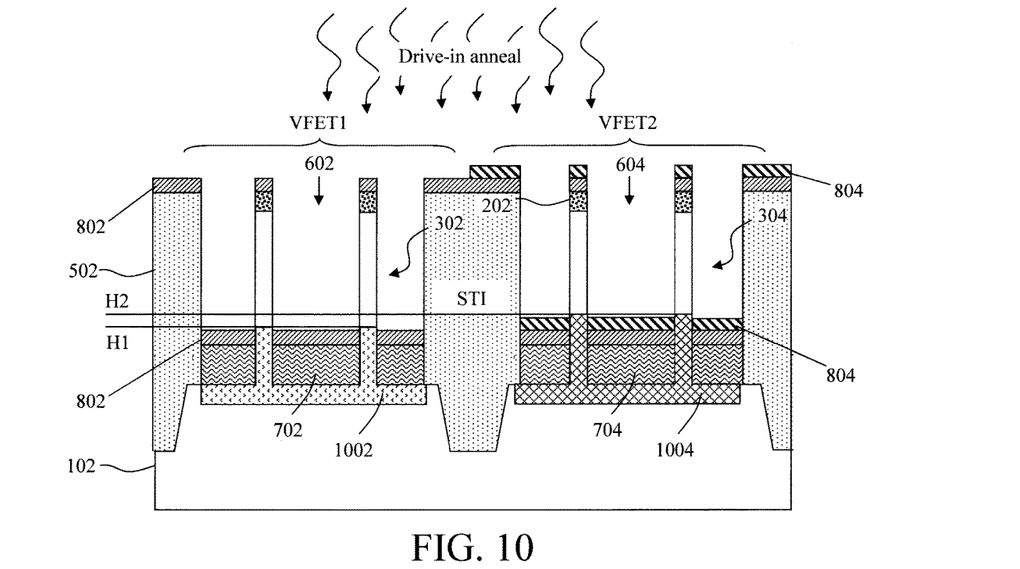
FIG. 10 is a diagram illustrating a drive-in anneal having been performed to i) drive dopants from the bottom source and drains into the first fins (forming bottom junction at height H1), and ii) drive dopants from the bottom source and drains and the second bottom spacers (as an additional dopant source) into the second fins (forming bottom junction at height H2, wherein H2>H1) according to an embodiment of the present invention.

As shown in FIG. 10, dopant diffusion regions 1002 are now present in the VFET1 (longer gate length Lg1) region of the substrate 102 extending to a height H1 in fins 302. By contrast dopant diffusion regions 1004 are present in the VFET2 (shorter gate length Lg2) region of the substrate extending to a height H2 in the fins 304, whereby H1<H2. The fins 302 and 304 above the dopant diffusion regions 1002 and 1004 are the vertical fin channels of the VFET1 and VFET2 devices, respectively, alongside which gates will be formed (see below). Thus, since the fins 302 and 304 have the same fixed height (see above), and the dopant diffusion region 1004 extends farther into the fins 304 (i.e., to height H2) than the dopant diffusion region 1002 extends into the fins 302 (i.e., to height H1), then the vertical fin channels will be shorter alongside the gates in fins 304 than the vertical fin channels alongside the gates in fins 302.

Gates (i.e., a gate dielectric and a gate conductor) are next formed alongside the fins 302 and 304 above the bottom source and drains 702 and 704. It is notable that the process now resumes to concurrent co-fabrication of both VFET1 and VFET2 devices.

To form the gate, an interfacial oxide 1102 (e.g., $SiO_2$ which may include other chemical elements in it such as nitrogen, germanium, etc.) is first formed selectively on exposed surfaces of the fins 302 and 304 by an oxidation process to a thickness of from about 0.3 nanometers (nm) to about 5 nm, and ranges therebetween, e.g., about 1 nm. A conformal gate dielectric 1104 is then deposited 1) into the trench 602 onto the fins 302 over the interfacial oxide 1102 and onto (STI) insulator 502 and the first bottom spacers 802, and 2) into the trench 604 onto the fins 304 over the interfacial oxide 1102 and onto the (STI) insulator 502 and the second bottom spacers 804. A gate conductor 1106 is then deposited onto the conformal gate dielectric. See FIG. 11.

Figure 11:
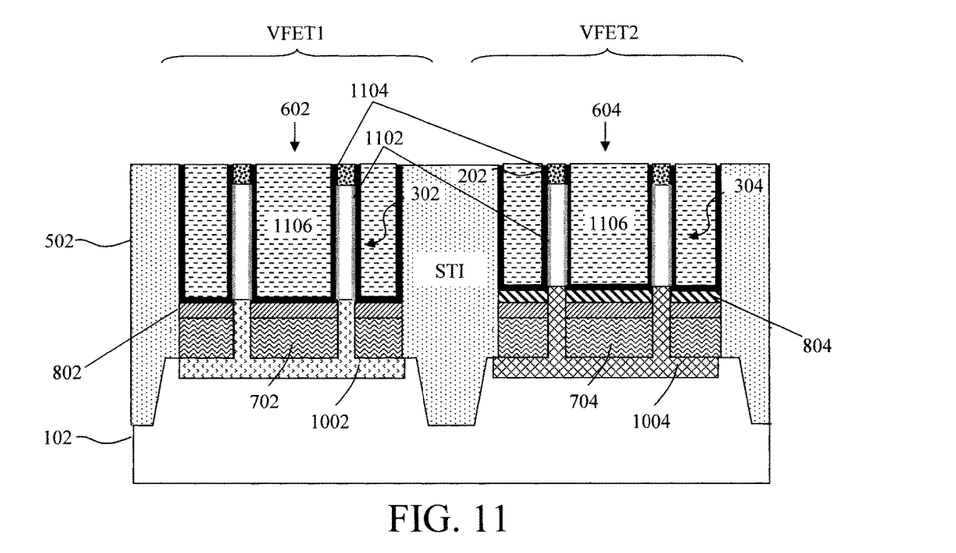
FIG. 11 is a diagram illustrating gates having been formed alongside the fins above the bottom source and drains according to an embodiment of the present invention.

According to an exemplary embodiment, a metal gate is formed wherein the gate conductor 1106 is a metal or combination of metals and the gate dielectric 1104 is a high-κ dielectric. For instance, the gate conductor 1106 is a workfunction setting metal. The particular workfunction metal employed can vary depending on whether an n-type or p-type transistor is desired. Suitable n-type workfunction setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction setting metals include, but are not limited to, TiN, TaN, and tungsten (W). TiN and TaN are relatively thick (e.g., greater than about 2 nm) when used as p-type workfunction metals. However, very thin TiN or TaN layers (e.g., less than about 2 nm) may also be used beneath Al-containing alloys in n-type workfunction stacks to improve electrical properties such as gate leakage currents. Thus, there is some overlap in the exemplary n- and p-type workfunction metals given above. Suitable high-κ gate dielectrics include, but are not limited to, $HfO_2$ and/or lanthanum oxide ($La_2O_3$).

Figure 12:
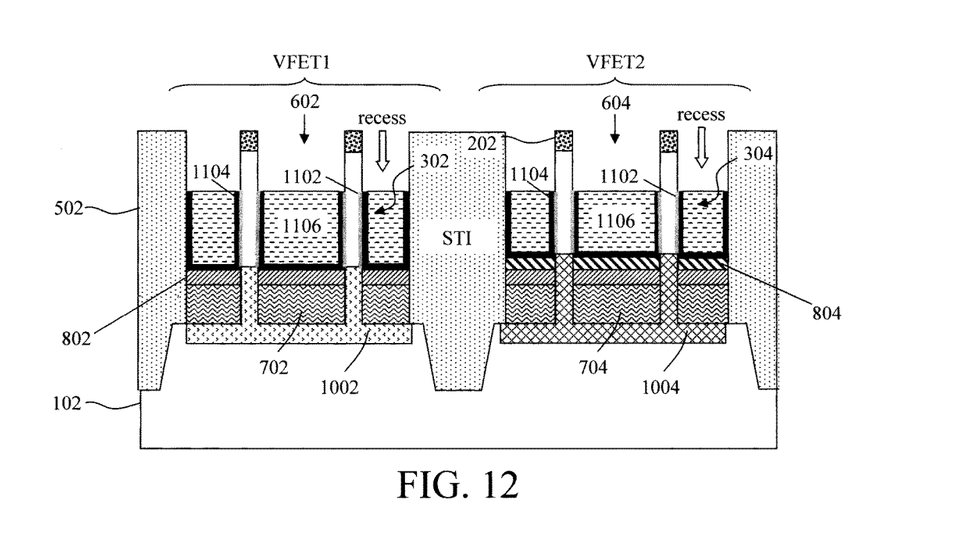
FIG. 12 is a diagram illustrating the gates having been recessed according to an embodiment of the present invention.

The gates (i.e., interfacial oxide 1102, gate dielectric 1104 and gate conductor 1106) are then recessed to expose the tops of the fins 302 and 304 to permit formation of the top source and drains. See FIG. 12. Recessing the gates sets the gate height. As shown in FIG. 12, the gates are recessed to the same (gate) height in both the VFET1 and VFET2 regions of the wafer 102.

Top spacers 1302 are then formed above the gates at the tops of the fins 302 and 304. See FIG. 13. Suitable materials for the top spacers 1302 include, but are not limited to, a low-κ material such as SiOC and silicoboron carbonitride (SiBCN). Like the bottom spacers, the top spacers 1302 can be formed using a directional deposition process whereby the spacer material is deposited with a greater amount of the material being deposited on horizontal surfaces, as compared to vertical surfaces. Thus, when an etch is used on the spacer material, the timing of the etch needed to remove the spacer material from the vertical surfaces will leave the top spacers 1302 shown in FIG. 13 on top of the gates since a greater amount of the spacer material was deposited on these (horizontal) surfaces to begin with.

Figure 13:
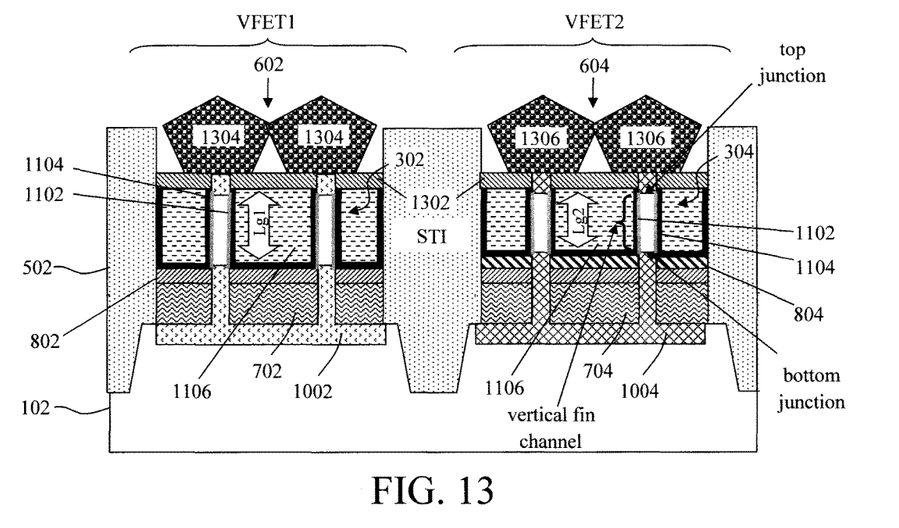
FIG. 13 is a diagram illustrating top spacers having been formed above the gates at the tops of the fins, and top source and drains having been formed over the top spacers at the tops of the fins according to an embodiment of the present invention.

Top source and drains 1304 and 1306 are then formed over the top spacers 1302 at the tops of the fins 302 and 304, respectively. According to an exemplary embodiment, the top source and drains 1304 and 1306 are formed from an in-situ doped (i.e., during growth) or ex-situ doped (i.e., via a process such as ion implantation) epitaxial material. Suitable epitaxial materials include, but are not limited to, epitaxial Si, Ge and/or SiGe. Suitable n-type dopants include phosphorous (P) and/or arsenic (As), and suitable p-type dopants include, but are not limited to, boron (B).

In one exemplary embodiment, dopants from the top source and drains 1304 and 1306 diffuse down (via only the epitaxy thermal budget or with additional dopant drive-in annealing) into the fins 302 and 304 to define top junctions (i.e., the junctions between the top source and drains 1304 and 1306 and the (undoped) portions of the fins 302 and 304 that serve as the vertical fins channels of the VFET1 and VFET2 devices, respectively). In another exemplary embodiment, the dopants are introduced into the fins 302 and 304 via an ex-situ doping method such as ion implantation. The location of the top junction is uniform amongst the VFET1 and VFET2 devices. However, as described above, the bottom junctions (i.e., the junction between the bottom source and drains 702 and 704 and the (undoped) vertical fin channels) will be higher (H2—see FIG. 10) in the VFET2 devices than that (H1, i.e., H2>H1) in the VFET1 devices due to the additional dopant source selectively provided by the second bottom spacers 804 in the VFET2 devices. As shown in FIG. 13, the vertical fin channels are the (undoped) portions of the fins 302 and 304 in between the bottom junctions and the top junctions.

As a result, the VFET1 devices have a gate length Lg1 and the VFET2 devices have a gate length Lg2, wherein Lg1>Lg2. See FIG. 13. According to an exemplary embodiment, Lg1=Lg2+x, wherein x is from about 2 nm to about 10 nm, and ranges therebetween.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method of forming a vertical field effect transistor (VFET) device, the method comprising the steps of:
    patterning fins having a uniform fin height in a substrate, wherein at least a first one of the fins comprises a vertical fin channel of a first VFET and wherein at least a second one of the fins comprises a vertical fin channel of a second VFET;
    forming bottom source and drains at a base of the fins, wherein the bottom source and drains are doped;
    forming first bottom spacers on the bottom source and drains at the base of the fins;
    selectively forming second bottom spacers on the first bottom spacers at the base of the at least one second fin, wherein the second bottom spacers are configured to serve as a dopant source;
    annealing the substrate under conditions sufficient to drive dopants i) from the bottom source and drains into the at least one first fin and ii) from the bottom source and drains and from the second bottom spacers into the at least one second fin, forming bottom junctions at the base of the at least one first fin having a height H1 and bottom junctions at the base of the at least one second fin having a height H2, wherein H2>H1;
    forming gates along sidewalls of the fins above the bottom source and drains, wherein the gates along the sidewalls of the at least one first fin have a gate length Lg1 and the gates along the sidewalls of the at least one second fin have a gate length Lg2, wherein Lg1>Lg2 based on H2>H1;
    forming top spacers above the gates at tops of the fins; and
    forming top source and drains above the top spacers at the tops of the fins.

2. The method of claim 1, wherein the second bottom spacer is formed from a material selected from the group consisting of: boron-doped glass (BSG) and phosphorous-doped glass (PSG).

3. The method of claim 1, wherein Lg1=Lg2+x, and wherein x is from about 2 nm to about 10 nm, and ranges therebetween.

4. The method of claim 1, wherein the conditions comprise a temperature and a duration.

5. The method of claim 4, wherein the temperature is from about 800° C. to about 1300° C., and ranges therebetween.

6. The method of claim 4, wherein the duration is from about 0.01 seconds to about 10 minutes, and ranges therebetween.

7. The method of claim 1, further comprising the steps of:
    forming the first bottom spacers on the bottom source and drains at the base of the fins;
    forming the second bottom spacers on the first bottom spacers at the base of the fins; and
    selectively removing the second bottom spacers from the at least one first fin.

8. The method of claim 7, further comprising the steps of:
    forming a block mask selectively masking the first bottom spacers and the second bottom spacers at the at least one second fin.

9. The method of claim 1, further comprising the steps of:
    patterning trenches in the substrate separating the at least one first fin from the at least one second fin; and
    burying the fins in an insulator that fills the trenches.

10. The method of claim 9, further comprising the step of:
    removing the insulator form along the sidewalls of the fins forming trenches in the insulator, wherein the fins are present in the trenches, and wherein the bottom source and drains are formed within the trenches at the base of the fins.

11. The method of claim 1, wherein the step of forming the gates comprises:
depositing a conformal gate dielectric onto the fins; and
depositing a gate conductor onto the gate dielectric.

12. The method of claim 11, wherein the conformal gate dielectric comprises a high-κ dielectric selected from the group consisting of: hafnium oxide ($HfO_2$), lanthanum oxide ($La_2O_3$), and combinations thereof.

13. The method of claim 11, wherein the gate conductor comprises a workfunction setting metal selected from the group consisting of: titanium nitride (TiN), tantalum nitride (TaN), aluminum (Al)-containing alloys, titanium aluminide (TiAl), titanium aluminum nitride (TiAlN), titanium aluminum carbide (TiAlC), tantalum aluminide (TaAl), tantalum aluminum nitride (TaAlN), tantalum aluminum carbide (TaAlC), tungsten (W), and combinations thereof.

14. The method of claim 1, wherein the step of patterning the fins comprises the steps of:
forming mandrels on the substrate;
forming sidewall spacers on opposite sides of the mandrels;
selectively removing the mandrels leaving behind the sidewall spacers; and
using the sidewall spacers to pattern the fins in the substrate.

15. A VFET device, comprising:
fins patterned in a substrate to a uniform fin height, wherein at least a first one of the fins comprises a vertical fin channel of a first VFET and wherein at least a second one of the fins comprises a vertical fin channel of a second VFET;
bottom source and drains at a base of the fins, wherein the bottom source and drains are doped;
first bottom spacers disposed on the bottom source and drains at the base of the fins;
second bottom spacers disposed on the first bottom spacers at the base of only the at least one second fin, wherein the second bottom spacers are configured to serve as a dopant source such that bottom junctions at the base of the at least one first fin having a height H1 and bottom junctions at the base of the at least one second fin having a height H2, and wherein H2>H1;
gates disposed along sidewalls of the fins above the bottom source and drains, wherein the gates along the sidewalls of the at least one first fin have a gate length Lg1 and the gates along the sidewalls of the at least one second fin have a gate length Lg2, wherein Lg1>Lg2 based on H2>H1;
top spacers above the gates at tops of the fins; and
top source and drains above the top spacers at the tops of the fins.

16. The VFET device of claim 15, wherein the second bottom spacer is formed from a material selected from the group consisting of: BSG and PSG.

17. The VFET device of claim 15, wherein Lg1=Lg2+x, and wherein x is from about 2 nm to about 10 nm, and ranges therebetween.

18. The VFET device of claim 15, wherein the gates comprise:
a conformal gate dielectric disposed on the fins; and
a gate conductor disposed on the gate dielectric.

19. The VFET device of claim 18, wherein the conformal gate dielectric comprises a high-κ dielectric selected from the group consisting of: $HfO_2$, $La_2O_3$, and combinations thereof.

20. The VFET device of claim 18, wherein the gate conductor comprises a workfunction setting metal selected from the group consisting of: TiN, TaN, Al-containing alloys, TiAl, TiAlN, TiAlC, TaAl, TaAlN, TaAlC, W, and combinations thereof.

* * * * *